(12) United States Patent
Hicks

(10) Patent No.: US 10,511,828 B2
(45) Date of Patent: Dec. 17, 2019

(54) CAMERA PLATFORMS WITH ROLLING LIGHT PROJECTION

(71) Applicant: INTEL CORPORATION, Santa Clara, CA (US)

(72) Inventor: Richmond Hicks, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 15/473,428

(22) Filed: Mar. 29, 2017

(65) Prior Publication Data

US 2018/0288388 A1 Oct. 4, 2018

(51) Int. Cl.
| | |
|---|---|
| H04N 13/254 | (2018.01) |
| H04N 13/257 | (2018.01) |
| H04N 13/296 | (2018.01) |
| H01S 5/00 | (2006.01) |
| H01S 5/42 | (2006.01) |
| H04N 5/353 | (2011.01) |
| G02B 26/08 | (2006.01) |
| G02B 26/10 | (2006.01) |

(52) U.S. Cl.
CPC ......... H04N 13/254 (2018.05); H01S 5/0071 (2013.01); H01S 5/42 (2013.01); H04N 13/257 (2018.05); H04N 13/296 (2018.05); *G02B 26/0833* (2013.01); *G02B 26/105* (2013.01); *H04N 5/3532* (2013.01)

(58) Field of Classification Search
CPC ....... H04N 2213/001; H04N 2213/005; H04N 13/20
See application file for complete search history.

(56) References Cited

U.S. PATENT DOCUMENTS

| | | | | |
|---|---|---|---|---|
| 7,453,980 | B1 * | 11/2008 | Gilevich | G01N 23/04 378/57 |
| 10,110,972 | B2 * | 10/2018 | Yamagishi | H04L 65/4084 |
| 2003/0231834 | A1 * | 12/2003 | Massey | G02B 6/4221 385/52 |
| 2004/0174778 | A1 * | 9/2004 | Buchler | G11B 7/0053 369/44.13 |
| 2005/0001142 | A1 * | 1/2005 | Lauffenburger | G01J 1/32 250/205 |

(Continued)

*Primary Examiner* — Pankaj Kumar
*Assistant Examiner* — Timothy R Newlin
(74) *Attorney, Agent, or Firm* — Green, Howard & Mughal LLP.

(57) ABSTRACT

Projector with rolling illumination to incrementally project a pattern over a scene within an image sensor FOV. Only a portion of the FOV is illuminated by the projected pattern at any given instant in time. The image sensor may be operable with a rolling shutter to incrementally collect a frame of image data representative of the scene. The projection roll position and rate may be synchronized with the roll position and rate of the image sensor shutter so that the portion of a scene illuminated by the projector at any given instant in time spatially overlaps the portion of the scene being sampled by the image sensor. When a shutter has rolled through one complete integration cycle over a frame time, the pattern projector has also rolled through one complete illumination cycle. Lower projector duty cycles associated with rolling illumination may enable more efficient operation and/or higher on-state radiant intensities.

13 Claims, 12 Drawing Sheets

(56) References Cited

U.S. PATENT DOCUMENTS

| | | | | |
|---|---|---|---|---|
| 2013/0147921 A1* | 6/2013 | Mor | ................... | G02B 27/0983 |
| | | | | 348/46 |
| 2014/0036139 A1* | 2/2014 | Hamada | ............. | H04N 5/23212 |
| | | | | 348/353 |
| 2014/0104431 A1* | 4/2014 | Eikenes | ................ | H04N 7/142 |
| | | | | 348/159 |
| 2014/0240464 A1* | 8/2014 | Lee | ......................... | G01S 17/08 |
| | | | | 348/47 |
| 2014/0285818 A1* | 9/2014 | Holz | ....................... | G01S 17/42 |
| | | | | 356/614 |
| 2014/0340482 A1* | 11/2014 | Kanarowski | ......... | G02B 21/367 |
| | | | | 348/46 |
| 2015/0146089 A1* | 5/2015 | Ovsiannikov | ........ | H04N 5/2353 |
| | | | | 348/362 |
| 2015/0215547 A1* | 7/2015 | Muller | ................ | G01J 3/2803 |
| | | | | 348/598 |
| 2015/0281671 A1* | 10/2015 | Bloom | ............... | G01B 11/2527 |
| | | | | 348/46 |
| 2015/0312504 A1* | 10/2015 | Aldridge | ............. | H04N 5/3743 |
| | | | | 348/157 |
| 2015/0341619 A1* | 11/2015 | Meir | ....................... | G01S 17/06 |
| | | | | 348/47 |
| 2016/0105597 A1* | 4/2016 | Ke | ......................... | G03B 15/05 |
| | | | | 348/362 |
| 2016/0327779 A1* | 11/2016 | Hillman | ............... | G02B 21/367 |
| 2016/0360074 A1* | 12/2016 | Winer | ................... | H04N 5/2353 |
| 2016/0373728 A1* | 12/2016 | Cho | ....................... | H04N 13/128 |
| 2017/0180654 A1* | 6/2017 | Swaminathan | ...... | H04N 13/254 |
| 2018/0227605 A1* | 8/2018 | Yamagishi | ........... | H04N 21/235 |
| 2018/0288388 A1* | 10/2018 | Hicks | ..................... | H01S 5/183 |

\* cited by examiner

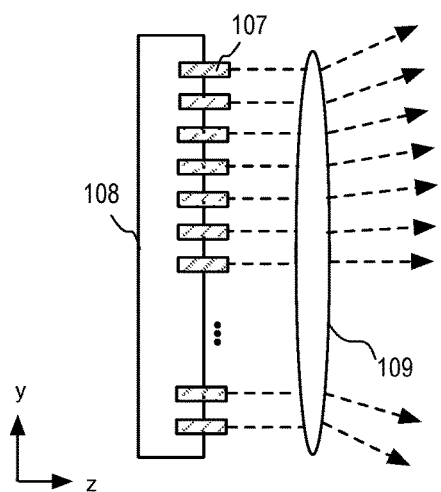
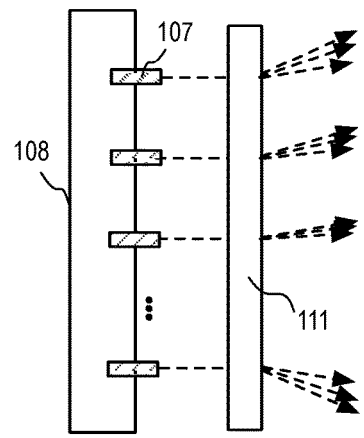
FIG. 1B   FIG. 1C
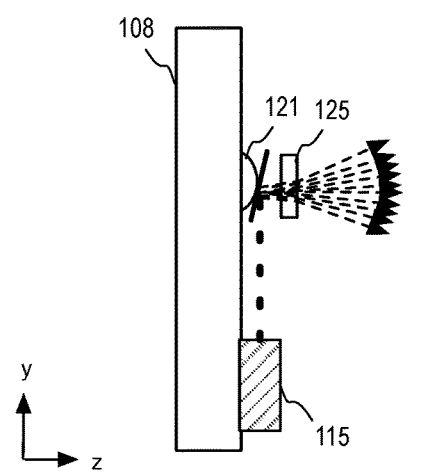
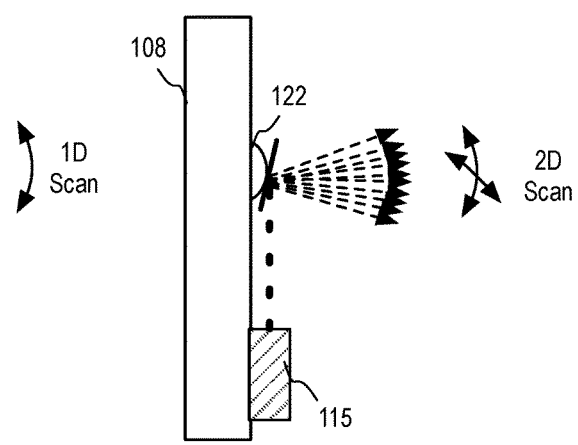
FIG. 1D   FIG. 1E

CAMERA PLATFORMS WITH ROLLING LIGHT PROJECTION

BACKGROUND

A digital camera is a component often included in electronic media device platforms. Digital cameras are now available in wearable form factors (e.g., video capture earpieces, video capture headsets, video capture eyeglasses, etc.), as well as embedded within smartphones, tablet computers, and notebook computers, etc. Digital cameras include image sensors with 2D arrays of photosensitive areas (photodiodes) where light is collected and converted into charge (photocharge). The photocharge is a function of the amount of light collected, which is dependent on both the light intensity and the duration of collection. Photocharge is read out and correlated with spatial position within the array to construct a representative image of a scene from which the light was collected.

Three-dimensional (3D) cameras are becoming more common, and can now be found on many mobile devices/platforms. These devices provide enhanced entertainment and utility experiences to an end user. For example, photography may be enhanced by depth information output from the 3D camera. Depth information may be derived through one or more techniques including stereo imaging, structured light, coded light, time of flight (TOF), and lidar. Deriving depth information in a manner that is dependent on features in the scene is challenging because suitable features may not always available. Technologies that address this challenge are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 1B, 1C, 1D, and 1E further illustrates schematics representing a side views of a projector, in accordance with some embodiments;

DETAILED DESCRIPTION

Figure 1A:
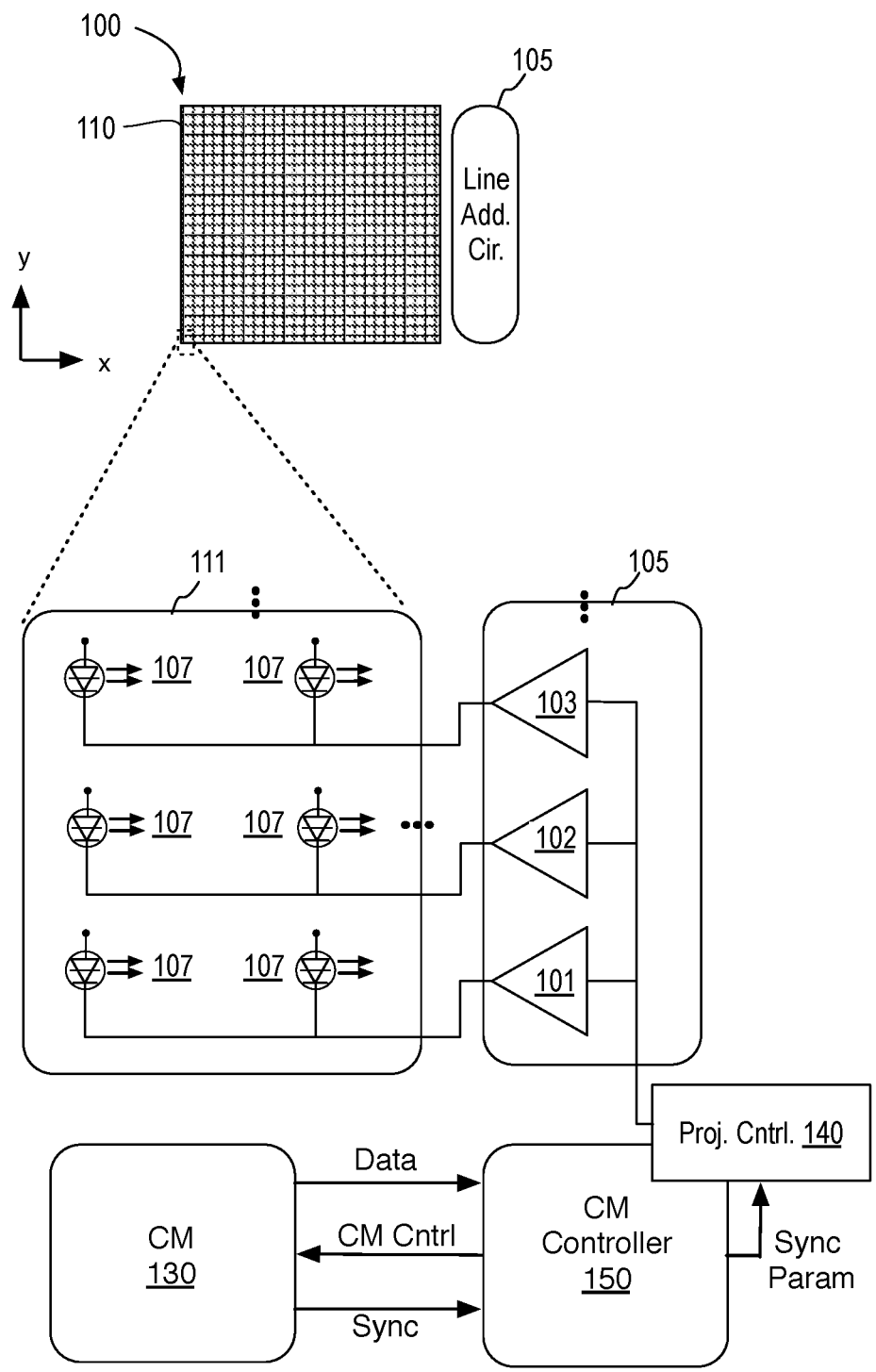
FIG. 1A is a schematic of a rolling light projector, in accordance with some embodiments.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, a camera platform with one or more image sensor includes a light projector operable to project a pattern on a scene within a field of view (FOV) of the image sensor. The image sensor may be advantageously operable with a rolling shutter to incrementally collect a frame of image data representative of the scene. A rolling shutter is a method of capturing an image that does not collect light with the entire sensor simultaneously, but rather different parts of the sensor generate photocharge at different points in time. The shutter roll may be column-based where columns of sensor pixels read out in sequence from left to right (or right to left) of a 2D sensor array. The shutter roll may be row-based where rows of sensor pixels read out in sequence from top to bottom (or bottom to top) of the 2D sensor array. With a rolling shutter the image sensor collects light from only a portion of the sensor FOV at any given instant in time rather than collecting the entire frame of image data at the same instant in time, which is often referred to as a "global shutter." With a rolling shutter, one scene is collected as an image frame only after sufficient time increments have passed to roll through all portions of the sensor that are consecutively reset, allowed to integrate charge in response to light exposure, and then read out. This duration is referred to as the frame time.

In accordance with embodiments herein, a projector is advantageously operable with a rolling illumination to incrementally project a pattern over the image sensor FOV with only a portion of that FOV illuminated by the projection at any given instant in time. Rather than illuminating the entire scene concurrently, the illumination pattern generated by the rolling projector will cover the image sensor FOV only after sufficient time increments have passed. In exemplary embodiments where the projection roll position and rate is synchronized with the roll position and rate of the image sensor shutter, the portion of a scene illuminated at any given instant in time spatially overlaps the portion of the scene being sampled by the image sensor. When a shutter has rolled through one complete cycle, capturing a complete image frame over a frame time, the pattern projector is to also have rolled through one complete illumination cycle ensuring that the image frame was effectively fully illuminated by the projected pattern. Rolling projector embodiments described herein are therefore spatially and temporally synchronized with a camera's rolling shutter.

In contrast, a projector that casts a pattern over an entire scene simultaneously (or scans over the scene in any unsynchronized manner) would do so for the entire time required for an image sensor to collect a full image frame. Such a projection technique favors the use of a global shutter in which all pixels of a sensor array actively sample the illuminated scene concurrently, thereby minimizing the "on-time" of the projector light source. However, a global shutter significantly increases the size and cost of a camera module relative to architectures employing a rolling shutter. A projector that casts a pattern over an entire scene simultaneously is relatively inefficient for a rolling shutter camera module because power is wasted to illuminate portions of the scene not concurrently sampled by the sensor. This inefficiency becomes greater as sensor pixel integration time decreases and the number of lines (e.g., rows) of a sensor array integrating at any given time instant decreases.

The radiant intensity or flux of a projector is a function of the permissible peak power level of the projector light source. To avoid failures associated with overheating, projector light source power may be limited by the on-time required for a projector that casts a pattern over an entire scene simultaneously. Yet, a projected pattern cast with lower projector light source power is more readily washed out by interference from external sources (e.g., ambient light), reducing the ability to determine depth data. An advantage of rolling projector embodiments described herein is that the peak power of a projector light source may be increased relative to a projector that casts a pattern over an entire scene simultaneously. Embodiments herein may therefore offer superior projection pattern signal to noise ratio (SNR). In further embodiments, peak power of a projector light source may be controlled as a function of the sensor integration time. As such, brighter scenes can be illuminated with a projected pattern of greater radiant flux than scenes with lower ambient light levels because correspondingly shorter "projector-on" periods enable a lower average projector light source operating temperature. Hence, the embodiments described further below may achieve one or more of reduced projector power consumption and superior projection pattern signal to noise ratio (SNR), for example.

Both the radiant intensity and duty cycle of a rolling projector light source may be controlled based on various camera control parameters that have become well-developed for rolling shutter camera hardware modules (CMs). An exemplary control parameter is integration time, which may be determined according to an auto-exposure algorithm. Embodiments herein may therefore be integrated synergistically with existing 2D camera technology to improve 3D camera capabilities.

FIG. 1A is a schematic of a camera platform with a rolling projector that includes light a projection array 100 operable in a rolling mode, in accordance with some embodiments. As shown, light projection array 100 includes a plurality of light emission elements (emitters) 110, for example configured into a 2D spatial array. One or more of these emitters may be grouped into subsets or "lines," each of which controllable independently from the other subsets within the 2D spatial array. A line may be vertical, horizontal or of any other spatial grouping, but preferably has some spatially correlation to lines of a rolling camera shutter that is to be operated in conjunction with light projection array 100. Hence, assuming a camera hardware module (CM) 130 has a rolling shutter that integrates row-by-row, an independently controllable line of light projection array 100 may also be a "row," which in the simplest form corresponds to one physical row of emission elements 110 extending horizontally (e.g., x-dimension) within the 2D emitter array. Each row of emission elements 110 are then operable to be driven (turned "on"), or not (turned "off"), independently of all other rows. On/off periods of a line correspond to a line's duty cycle.

In some advantageous embodiments, each emission element 110 originates highly-collimated light. While the emission band may vary with implementation, in some examples emission is within the NIR band (e.g., ~850 nm). In some such embodiments, the emitter is a vertical cavity surface-emitting laser (VCSEL). Projection array 100 may be anywhere from a 10×10 VCSEL array to a 100×100 VCSEL array, or more, for example. Each VCSEL may correspond to an individual element of the projector (i.e., a projector pixel, or "proxel"), or the beams may be split into multiple elements by a secondary optical component. As further shown in the expanded view 111, rows of VCSELs 107 are grouped together by circuitry that enables each row to be driven independently of other rows. In the illustrated example, a first row of VCSELs 107 is coupled through first metallization traces to a first driver 101, a second row of VCSELs 107 is coupled through second metallization traces to a second driver 102, a third row of VCSELs 107 is coupled through third metallization traces to a third driver 103, etc. Drivers 101-103 are further coupled (e.g., through bus circuitry) to a projector controller 140 operable to dictate the activity of drivers 101-103. Many other architectures are also possible for achieving row-based VCSEL control. For example, a drive voltage may be passed from projector controller 140 through line addressing circuitry 105 to drive one or more VCSEL row at any given time. Projector controller 140 is functionally consider a component of a rolling projector, but of course can be physically integrated with array 101 or any other component of a camera platform.

FIG. 1B further illustrates a schematic representing a side view of a projection array in which there is a 1:1 correspondence between VCSELs 107 and illumination points (e.g., dots) projected onto a scene. As shown, each VCSEL 107 is assembled into an array (2D) over substrate 108. Each VCSEL 107 emits through a projection lens casting the respective beams to illuminate points within a scene. Each illustrated VCSEL 107 represents a line (e.g., row) of VCSELs 107 that may be controlled independently of the other illustrated lines of VCSELs 107 to separately control timing of lines of the pattern projection. FIG. 1C further illustrates a schematic representing a side view of a projection array in which there is a 1:N correspondence between VCSELs 107 and illumination points (e.g., dots) projected onto a scene. As shown, each VCSEL 107 is assembled into an array (1D) over substrate 108. Each VCSEL 107 emits through a microlens array or diffractive element (e.g., grating) 111 to cast N beams to illuminate a line of points within a scene. Each illustrated VCSEL 107 may be controlled independently of the other illustrated VCSELs 107 to separately control timing of lines of the pattern projection.

In some alternative embodiments, an emitter of a projector includes a scanning MEMS mirror. The MEMS mirror sweeps the illumination pattern across a camera field of view to sequentially cast a light pattern upon portions of the scene in synchronization with the sequential light collection. A 1D or 2D scanner may be employed with a single light source (e.g., a laser) to synchronize sequential projection with the sequential light collection. FIG. 1D further illustrates a schematic representing a side view of a projector including an edge emitting laser 115 and a 1D MEMs scanner 121 mounted to substrate 108. Light from laser 115 is conveyed by scanner 121 through microlens array or diffractive element (e.g., grating) 125. Additional optical elements may also be employed in the optical path according to known techniques for conditioning a optical beam. Examples include a diffusers, integrators, and collimators. MEMs scanner 121 is configured to scan or raster over a first projection angle (e.g., vertically) to vary the illumination point location along a first axis (e.g., y-axis) in response to an electrical signal applied thereto, for example sent by projector controller 140. Light from laser 115 may be pulsed over the scan angle of the mirror to generate a speckle pattern, for example. Microlens array or diffractive element (e.g., grating) 125 splits the light conveyed by scanner 121 across a second dimension of the field of illumination (e.g., along x-axis). To synchronize consecutive illumination, the scanner sweep angle is varied over a frame time to illuminate the corresponding portion of the camera FOV that is being concurrently sampled by lines of the image sensor.

FIG. 1E further illustrates a schematic representing a side view of a projector emitter including edge emitting laser 115 and 2D MEMS scanner 122 mounted to substrate 108. Additional optical elements may also be employed in the optical path according to known techniques for conditioning a optical beam. Examples include a diffusers, integrators, and collimators. 2D MEMs scanner. MEMs scanner 122 is configured to scan over both a first projection angle (e.g., vertically) and orthogonal second projection angle (e.g., horizontally) to vary the illumination point location along a first axis (e.g., y-axis) and second axis (e.g., x-axis) in response to an electrical signal applied thereto, for example sent by projector controller 140. Light from laser 115 may be pulsed over the scan angles of the mirror to generate a speckle pattern, for example. To synchronize consecutive illumination, one of the scanner sweep angles may be varied over a frame time to illuminate the corresponding portion of the camera FOV that is being concurrently sampled by lines of the image sensor.

In some other alternative embodiments, an emitter of a projection array comprises a mirror of a deformable micromirror device (DMD). Such embodiments may be well suited to structured or coded light techniques, for example. In such embodiments, the projection array may vary from less than a 100×100 mirror array to a 1000×1000 mirror array, or more. In addition to the projection array, such a projector may further include one or more edge-emitting (or surface emitting) laser light sources configured to shine on all, or a portion of, the mirror array. Each mirror in the array may correspond to an individual element of the projector (i.e., a proxel), or the beams may be split into multiple elements by a secondary optical component, such as a diffraction grating or microlens array. One mirror orientation (e.g., +10°) turns a proxel "ON" and the other mirror orientation (e.g., −10°) turns the proxel "OFF".

Returning to FIG. 1A, CM 130 outputs data that may include image data collected by an image sensor (e.g., CMOS sensor), as well as other metadata associated with operation of CM 130. CM 130 also outputs a sync signal associated with one or more of horizontal vertical blanking periods, for example as further described below. The data and sync signal is output from CM 130 and communicated to CM controller 150, which may be any scalar processor, for example, and operates on the received data. CM Controller 150 outputs to CM 130 one or more CM control parameters, for example generated based on one or more camera control algorithms (CCA), such as, but not limited to, 3A algorithms include automatic white balancing (AWB), automatic focus (AF), and automatic exposure control (AEC). In some embodiments, one or more of the CM control parameters passed to CM 130 are also employed by projector controller 140 for synchronizing light pattern projection with operation of an image sensor within CM 130. For example, an integration time computed through execution of an AEC algorithm may be employed by CM 130 to set an integration time for a sensor, and further employed by projector controller 140 to set a corresponding duty cycle and peak power (or at least one of these projector parameters) for the independently controllable lines of projector array 100. Projector controller 140 may comprise any fixed function or programmable logic circuitry and may be implemented as part of CM controller 150, or as a separate hardware resource. Projector controller 140 may also be implemented as part of CM 130, particularly were light projection array 100 is also implemented as a component of CM 130.

Figure 2:
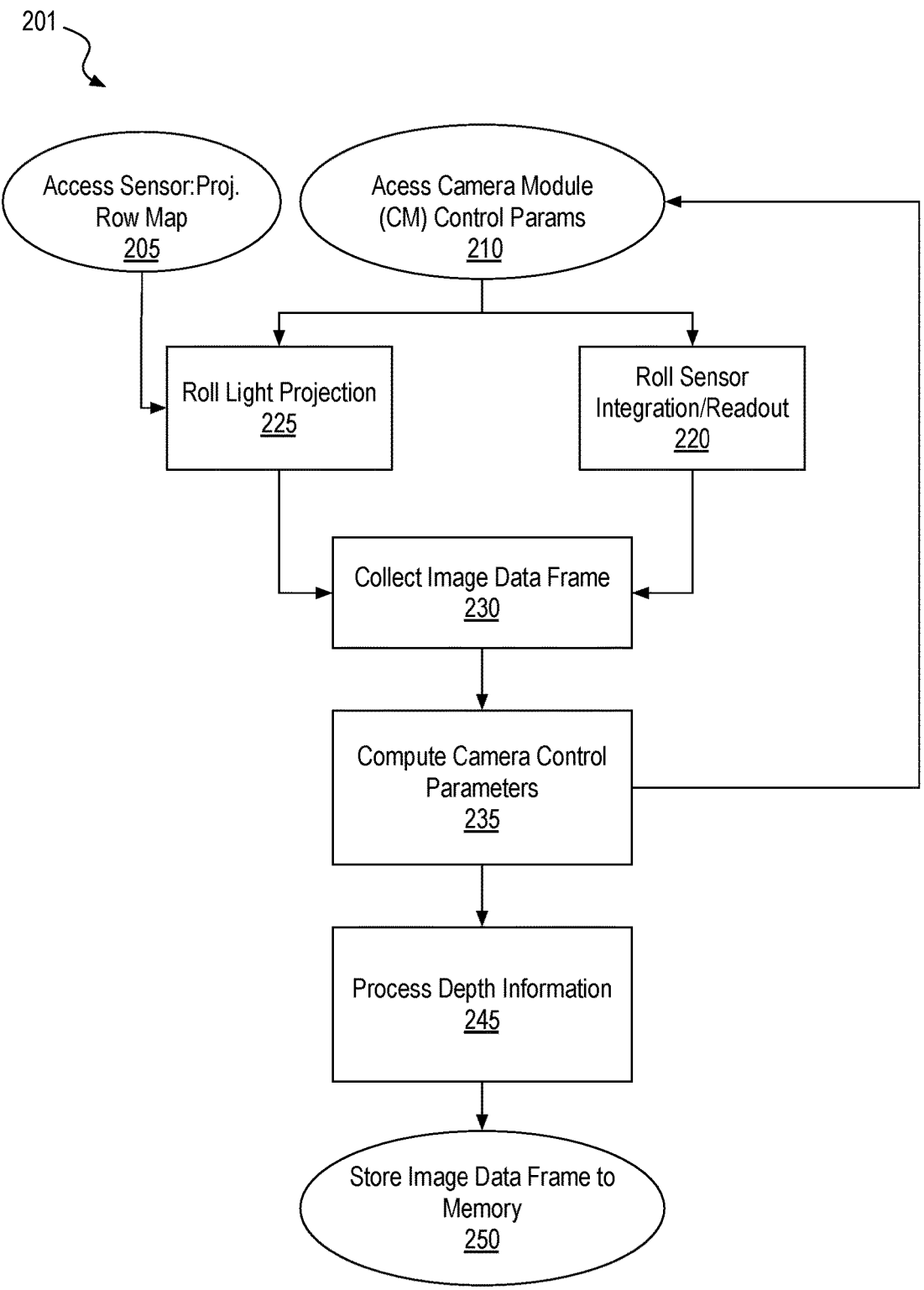
FIG. 2 is a method of rolling light projection and image capture, in accordance with some embodiments.

FIG. 2 illustrates a method 201 of rolling light projection in synchronization with image capture, in accordance with some embodiments. Method 201 may be performed with a camera platform that includes a projector capable of independent line-based (e.g., row-based) control, such as one including the light projection array 100 introduced above. Method 201 begins by accessing camera system data that maps one or more independently controllable emitters or emitter lines of a projector array to one or more sensor pixels or pixel lines of an image sensor. The sensor-to-projector mapping data may, for example, specify how many and/or which particular emitter or emitter lines of a projector array correspond to pixels or pixel lines in one or more image sensor(s) of a camera module. The projector line number(s) may be mapped to the image sensor(s) line number(s) based on the FOV of the image sensor(s) and the projector field of illumination. Such parameters are generally defined in a camera platform design, and may be precisely determined during a calibration phase of the platform manufacture.

Figure 3:
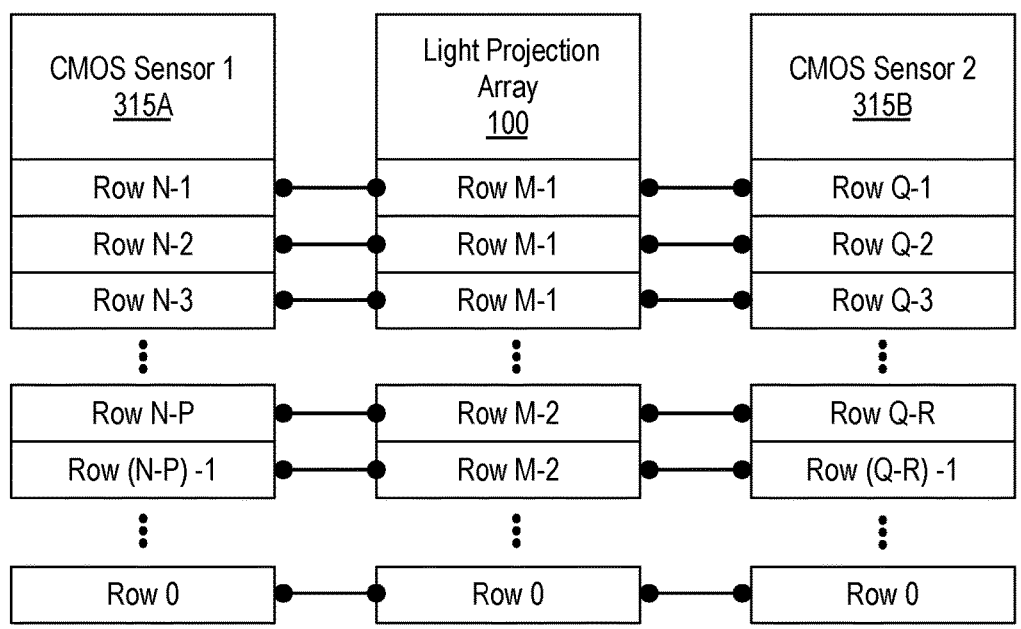
FIG. 3 is a table illustrating system data mapping rows of a projector array to rows of two image sensor array, in accordance with some embodiments.

FIG. 3 illustrates an exemplary table illustrating system data mapping rows of light projection array 100 to rows of a first CMOS sensor 315A, and to rows of a second CMOS sensor 315B. As shown, more than one sensor pixel row (e.g., Row N-1 through Row N-P) is mapped to a single light emitter row (e.g., Row M) reflecting the greater total number of rows and/or smaller field for sensor 315A than for projection array 100. Light emitter row M is similarly mapped to a plurality of rows (e.g., Row Q-1 through Row Q-R) of sensor 315B, which may also have a greater row count than the projector array, but a different row count and/or FOV than sensor 315A.

Returning to FIG. 2, one or more camera module (CM) control parameters are accessed or received at operation 210. The CM control parameters may be any known in the art to be suitable for controlling a camera module that employs a rolling shutter, such as, but not limited to, parameters configuring actions associated with frame collection (e.g., row exposure/integration time, row read out, row reset, blanking time, etc.) These CM control parameters may be written out to one or more register accessible to the CM. One or more of these CM control parameters may also be written out to one or more register accessible to a projector controller operable control projector row illumination. For example, an indication of the exposure/integration time may be made accessible to a projector controller.

One or more image sensor array of a CM is then operated in a rolling shutter mode according to the CM control parameters at operation 220 to sequentially collect light from portions of a scene within a field of view of the sensor array. A projector in accordance with one or more embodiments is concurrently operated at operation 225. The projector consecutively illuminates portions of a scene within the image sensor FOV according to the projector:sensor mapping data along with one or more of the control parameters. The illumination may project a fixed pattern, or a spatially or temporally coded pattern (e.g., structured or coded light pattern). At operation 225 a projector controller may implement the rolling illumination by driving consecutive individual rows of a light projection array to emit light and illuminate a portion of a scene corresponding to that being concurrently captured by the rolling shutter during operation 220. Hence, whether projecting a fixed pattern, coded pattern, structure light pattern, or otherwise, light is collected over consecutive portions of the scene as those portions are concurrently and consecutively illuminated at operation 225.

At operation 230 image data is read out from the image sensor as the shutter rolls through consecutive lines (e.g., rows) of the sensor array. In one exemplary embodiment, the image data includes pixel values (e.g., indicative of light intensity) for each of a plurality of color channels. The color channels may be in any color space. In some embodiments, the image data includes color information in the RGB color space. In further embodiments, the image data includes an NIR channel. The image data may be received into an image signal processor (ISP), for example. At operation 235, one or more camera control algorithms may be executed based on the collected image data, and/or based on metadata received from the CM in association with the image data, to determine new CM control parameters that may be fed back to operation 210 for use during a subsequent iteration of method 201.

Method 201 continues at operation 245 the collected image data is processed to determine associated depth information. In some embodiments, at least NIR data is processed to determine pixel correspondence between a plurality of image frames. The depth information determined at operation 245 may be in the form of a depth map correlated with the image pixels, each having an image coordinate x,y associated with the image frame. In other embodiments, the depth information determined at operation 245 is in the form of a disparity map correlated with the image pixels, each having an image coordinate x,y associated with the image frame. For some disparity embodiments, image data collected at operation 230 may be accompanied by CM parameters, such as a camera focal length ($C_f$) and a camera baseline ($C_b$), from which disparity values for pixels in a first image (e.g., collected during by a first sensor at operation 230) may be estimated based on their correspondence with pixels in a second image (e.g., collected by a second sensor at operation 230). Disparity estimation may be by any known technique or algorithm, as embodiments herein are not limited in this respect. As an alternative to determining disparity between to rolling shutter sensors, in some other embodiments where the origin of a feature in an illumination pattern is known (e.g., as with structured light) the disparity may be determined between the projector and a single rolling shutter sensor. At operation 250, depth information may then be stored to memory in association with corresponding pixel data, completing method 201.

Figure 4:
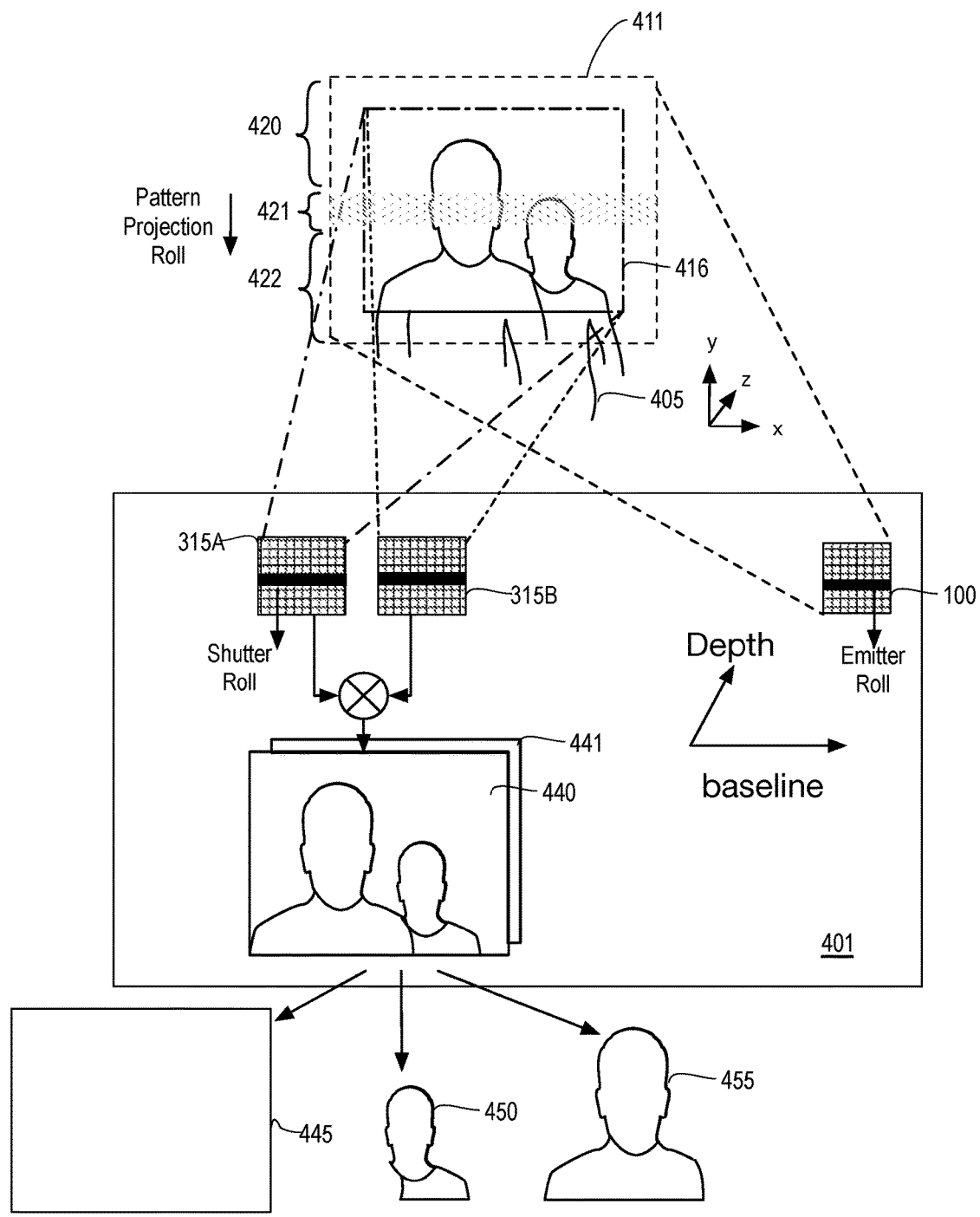
FIG. 4 is a schematic further illustrating operation of a camera platform including a rolling shutter and rolling light projector, in accordance with some embodiments.

FIG. 4 is a schematic further illustrating operation of a camera platform having a rolling shutter and rolling light projector, in accordance with some embodiments. In FIG. 4, a camera platform 401 is operable to collect one or more image frame of a real world scene 405. Within scene 405, depth is aligned with the z-axis. This is a simplification reasonable for a small FOV. Complications associated with larger FOV are omitted for the sake of brevity. Camera platform 401 includes first image sensor 315A, second image sensor 315B, and light projection array 100. In the illustrated embodiment, camera platform 401 may be considered an array camera having a plurality of image sensors 315A, 315B with a predetermined baseline relationship. Image sensors 315A and 315B may be of any known digital sensor architecture such as, but not limited to, a CMOS sensor array. Image sensors 315A, 315B are advantageously operable to collect RGB (e.g., 400-700 nm wavelengths) as well as NIR (e.g., 701-1200 nm) within camera FOV 416. CMOS image sensors are inherently NIR sensitive to some extent and may therefore by consider RGB(NIR) sensors. For some embodiments, camera platform 401 includes an image sensor and/or color filter configured to include a specific NIR channel, often referred to RGBNIR sensor as opposed to an RGB(NIR) sensor that does not have an independent NIR channel. Each image sensor may receive light through one or more aperture. Separate RGB and NIR apertures may be employed, for example. A filter array that passes both NIR and RGB within at least some portions of image sensor array may be disposed within the optical path. In one exemplary embodiment, the filter array is a Bayer color filter array (CFA). In other embodiments, the filter array is a NIR-enhanced filter array (e.g., where half of green filter tiles of the Bayer mosaic are replaced with a visible light blocker). Image sensors 315A, 315B may provide an intensity resolution of 10 bits, or more per pixel, and may be operable to capture continuous video frames progressively. Sensors 315A, 315B may have a pixel frequency of 25 MHz, or more. Camera platform 400 may further include an analog amplifier, an A/D converter, and other components to convert incident light into a digital signal corresponding to raw RGB and IR image data.

Each of image sensors 315A, 315B are to output image data captured from a different camera viewpoint. In exemplary embodiments, the image from each viewpoint is captured over substantially the same time span such that the two resulting image frames contain image data for a single scene 405. One of the image frames collected may be designated a reference and combined with the other into an image frame 440 having depth information. For example, where image sensor 315A has the same or higher resolution (e.g., 8 megapixel, or more) than image sensor 315B (e.g., 720p, HD, 8 megapixel, or more), image sensor 315A may provide a default reference image and image data from sensor 315B employed to determine disparity (or other depth) information associated with image frame 440. Image sensors 315A, 315B are each associated with predetermined baseline vector (length and direction) characterizing their different viewpoints. In an exemplary embodiment where image sensors 315A, 315B are on a mobile platform, the baseline vector may have a length of millimeters to tens of centimeters, depending on the form factor. In other embodiments, where image sensors 315A, 315B are separate infrastructure fixtures, baseline lengths may be on the order of meters. Additional image frames 441 having depth information may be collected over subsequent time intervals, for example generating 3D video.

Although two image sensors are illustrated in FIG. 4, any number of image sensors may be included in an array camera as embodiments herein are not limited in this respect. Alternative embodiments may also employ only a single image sensor. For single sensor embodiments, a baseline vector describing the relationship between the single image sensor (e.g., 315A) and light projection array 100 is employed to derive depth information. Projection array 100 may cast structured light that is collected by the image sensor and processed by any known technique to determine depth information for image frame 440 based on locations of discrete illumination points within a collected frame of image data and the known origin of the illumination points.

With multiple image sensors 315A and 315B, light projection array 100 need not cast structured light. In some exemplary embodiments, projector array 100 casts a fixed pattern of light, such as a pseudo-random speckle pattern 421, over the camera FOV 416. Although projector field of illumination 411 is larger than camera FOV 416, the projected speckle pattern 421 only illuminates a horizontal portion (i.e., a stripe or slice) of camera FOV 416 over a first time increment during which sensors 315A, 315B are sampling light from the portion of scene 405 illuminated by projected speckle pattern 421. As one example, while projection array 100 illuminates a slice of camera FOV 416 with a speckle pattern 421 comprising discrete points of IR illumination, the rows of image sensors 315A, 315B mapped to the same spatial area corresponding to the slice illuminated by speckle pattern 421 collect the IR speckle pattern along with RBG image data from scene 405.

Both the shutter and pattern projection roll in the downward direction as illustrated in FIG. 4. Non-illuminated portion 420 was previously illuminated, but at the instant of time represented in FIG. 4 portion 420 is not illuminated by projection array 100 and is not sampled by image sensors 315A, 315B. The image sensor read line might be at the interface between portion 420 and the portion of scene 405 illuminated by speckle pattern 421, for example. Similarly, non-illuminated portion 422 is next to be illuminated, but at the instant of time represented in FIG. 4 portion 422 is not illuminated by projection array 100 and is not sampled by image sensors 315A, 315B. The image sensor reset line may be at the interface between portion 422 and the portion of scene 405 illuminated by speckle pattern 421, for example.

Upon collecting image frame 440, depth information may be computed based at least in part on speckle pattern 421. For example, pixel correspondence may be deduced by determining disparity between discrete illumination points making up the speckle pattern. Such depth information may then be employed, for example, to assign segmentation labels to various segments in the scene. In the example illustrated in FIG. 4, three segments (background 445, subject 450 and subject 455) are identified from image frame 440 based, at least in part, on depth information determined from the speckle pattern. The segmentation shown in FIG. 4 is however only an example of the type of depth processing that might be performed.

Figure 5:
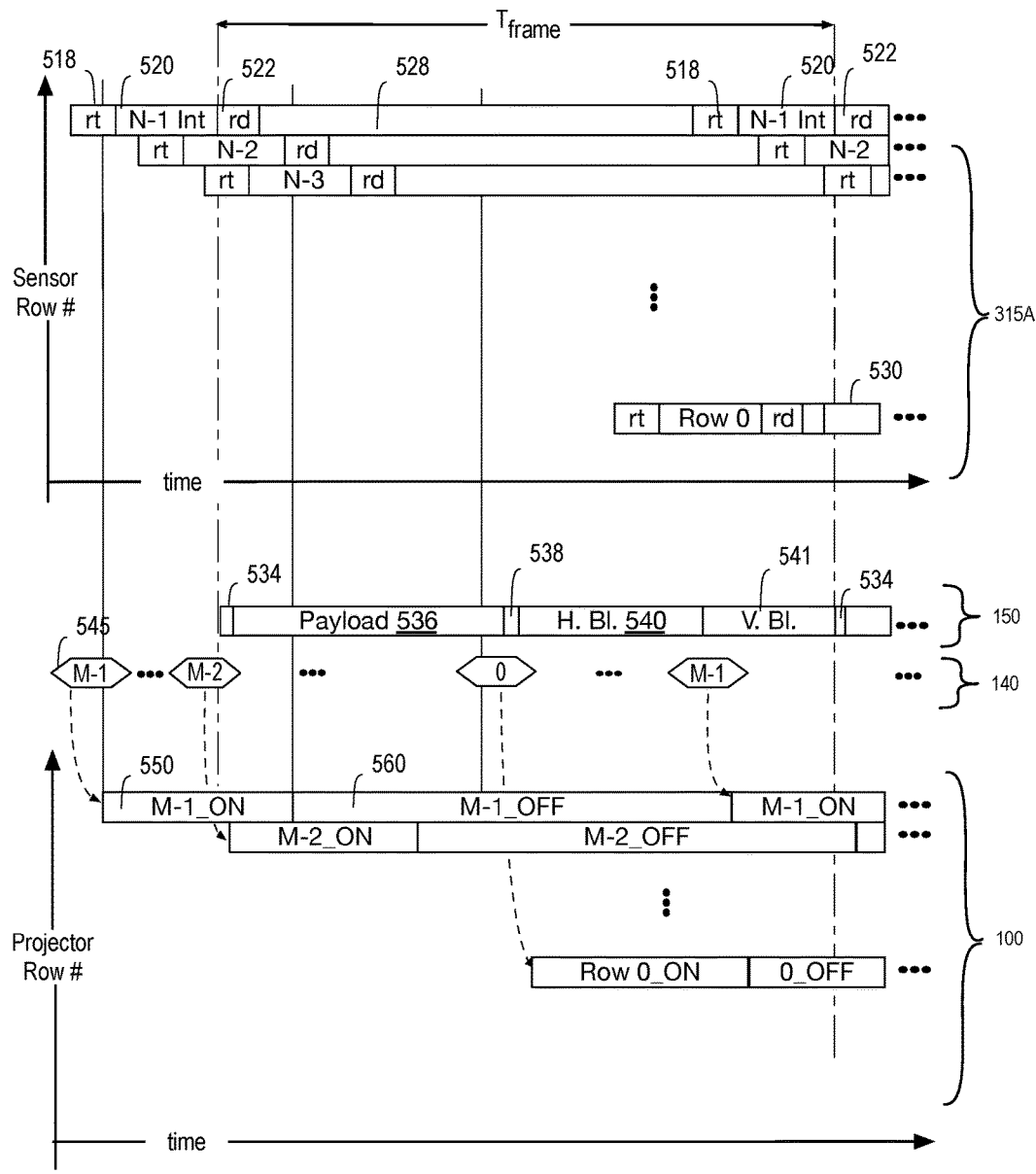
FIG. 5 is a timing diagram illustrating synchronization of an image sensor shutter roll with projector illumination roll, in accordance with some embodiments.

FIG. 5 is a timing diagram further illustrating synchronization between an image sensor shutter roll and a projector illumination roll, in accordance with some embodiments. In FIG. 5, activities of projection array 100, projector controller 140, CM controller 150, and image sensor array 315A are illustrated on two concurrent time lines where time runs from left to right. Image sensor array 315A is controlled to operate in a rolling shutter or electronic focal plane shutter mode where the pixels of the sensor array are reset for photocharging in a line-sequential (line-by-line) fashion. Readout is likewise in a line-sequential fashion for an entire frame. The line readout measures the amount of photocharge in the line since the last reset. When the reset moves some number of lines, the readout begins with the row first reset.

In this type of system, the integration times from line to line may overlap as a function of the intervals of time allotted to various actions. The time between the line reset (rt) 518 and the line read-out (rd) time 522 is the line (row) integration time or exposure time 520, which is the time allotted for accumulating photocharge in a one or more lines of pixels of the image array, or even just part of a line. The length of integration time 520 may be defined by varying the amount of delay between the reset and the readout.

Resets 518 are performed one at a time, sequentially within the frame, such that a time-staggered, diagonal column of integrations 520 corresponds to a frame including 0 through N-1 lines. The time required to roll through all lines is equal to the frame time $T_{frame}$. In FIG. 5, only four integration rows of a frame having 0 through N-1 rows are shown, as the vast number of rows in a typical image sensor is not shown here for the sake of clarity. Since resets 518 are offset in time, and integration time 520 is substantially the same throughout a single frame, a diagonal column is formed with uniform steps. Integration time 520 may vary (e.g., as a function of the brightness of a scene) from a single pixel clock up to a full frame time $T_{frame}$. Regardless of the length of integration time 520, readouts 522 are performed one at a time for each integration line consecutively through the frame. In FIG. 5, integrations for two consecutive frames are shown for row N-1 and row N-2. Relative timing of the consecutive readouts may be so maintained as integration time is varied. The frame length can be varied by adjusting frame blanking (e.g., vertical blanking) times to permit longer or shorter integration times, and/or lower or higher frame rates. Readout 522 may be separated from the next reset 518 in the same line (e.g., row) by an idle space 528. The idle space 528 may be varied so that the read cadence may be fixed independent of the integration time 520. A vertical blanking space may also be employed along with horizontal idle space 528 for synchronization with CM controller 150 tasked with receiving the data readouts.

In the illustrated examples, image data is streamed or transmitted from sensor 315A and received by CM controller 150. The image data received by CM controller 150 includes a start of field (SOF) 534, a payload portion 536 including image data for the multiple line integrations associated with a single frame. The payload portion 536 is followed by an end of field (EOF) 538, a horizontal blanking time 540, and a vertical blanking period 541 before data for a next frame begins. Metadata (e.g., exposure data) may also be embedded in the start of field 534 and/or end of field portions 538.

Light projection array 100 is controlled to operate in a rolling projection mode where the lines of the projection array are turned "on" in a line-sequential (line-by-line) fashion for an entire frame. While a line is in the "on" state, a light pattern is cast onto the scene with each emission element in the line generating a point of light of the light pattern. Lines of the projection array are likewise turned "off" in a line-sequential fashion. While a line is in the "off" state, no emission element in the line is generating a point of light. A control parameter stream 545 is output by projector controller 140 and received by projection array 100 to synchronize the rolling illumination with the rolling shutter. With the switching between "on" and "off" states controlled to one line at a time, sequentially, the "on" times over multiple projector lines form a staggered, diagonal column of emission periods 550 corresponding to a projection array including 0 through M-1 lines. The time required to roll through all M lines of the projector is substantially equal to the frame time $T_{frame}$. Between emission periods 550 is a non-emission period 560 associated with the line of the array being in the "off" state. The duty cycle of a given line is a function of an apportionment of the frame time $T_{frame}$ between the "on" and "off" states. To maintain synchronization, the duty cycle may be constant for all lines of projection array 100 when integration time 520 is constant over all lines of sensor array 315A.

As a function of the mapping between projector lines and image sensor lines, a given projector line may remain "on" over cumulative integration times 520 for multiple sensor lines. For example, as shown in FIG. 5, emission period 550 for projector line M-1 spans the integration time 520 for both sensor lines N-1 and N-2. Upon a reset 518 at sensor line N-3, projector line M-2 begins an emission period 520. The emission periods for adjacent projector lines may overlap to the extent integration time of a first sensor line mapped to a first projector line overlaps with that of an adjacent sensor line mapped to a second projector line. For example, in FIG. 5, emission period 550 for projector lines M-1 and M-2 overlap by the same amount integration time 520 for sensor lines N-2 and N-3 overlap. When the integration time for sensor line N-2 ends, projector line M-1 begins a non-emission period 560.

The emission period for a given projector line may therefore vary as a function of the number of sensor lines mapped to the projector line and the integration time. The emission period should be long enough for all mapped sensor lines to complete their respective integrations. The integration time may be a function of the ambient (RGB) brightness of the scene, and may be determined based on any suitable auto exposure algorithm. Emission time for a given projector line may also be set based on the integration time determined as a function of an auto exposure algorithm. Emission time may therefore be controlled to decrease as a function of integration time. Unless the frame rate is correspondingly increased, the projector line duty cycle will decrease with integration time. With longer cooling-off periods, emitters may be operated at higher peak power levels (e.g., through higher drive current and/or drive voltage). Hence, the radiant intensity of each emitter may be increased within the array, particularly under brighter ambient light conditions, without exceeding thermal limits of the projector. For embodiments where the projector emits in the NIR band, the higher NIR intensity can be more readily collected by an RGBNIR or RGB(NIR) image sensor. Integration times needed to ensure sufficient IR projected pattern detection may therefore be reduced. For outdoor conditions where ambient light may include sunlight with a significant IR component, a shorter integration time will reduce the sunlight noise. Hence detection of IR patterns projected in accordance with embodiments can have a higher SNR that is driven by both an increase IR projector signal and a reduction in IR noise.

Figure 6:
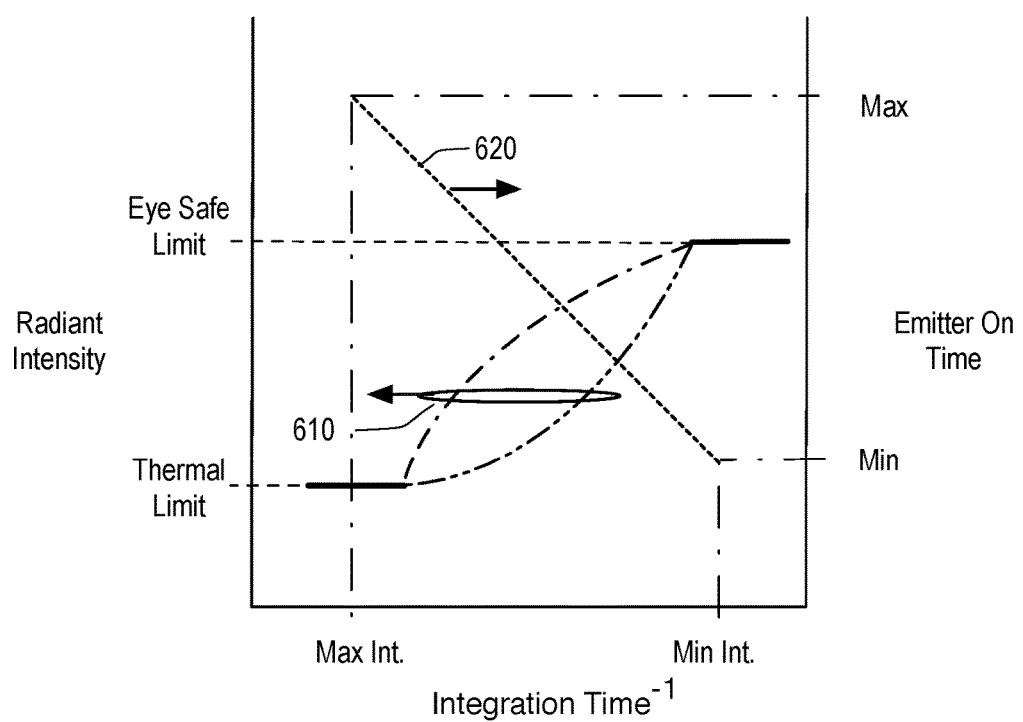
FIG. 6 is a graph illustrating relationships between rolling shutter operation rolling projector light source operation, in accordance with some embodiments.

FIG. 6 is a graph illustrating exemplary relationships between rolling projector light source operation and rolling shutter operation over a frame time, in accordance with some embodiments. As shown on the primary y-axis, radiant intensity of a single emitter 610 is a monotonically increasing function of inverse integration time. At longest sensor integration times where a projector emitter has the longest duty cycle, the radiant intensity of the emitter may be limited by an emitter power limit associated with the thermal limit of the projector. For example, in an IR VCSEL array each VCSEL may be operated at a power level that allows for near continuous projection when synchronized with a rolling shutter operating with maximum integration time. Power levels of each emitter in an array may be increased as integration time is reduced to yield an increase in radiant intensity of a projected pattern, which may increase pattern SNR. At shortest integration times where a projector emitter is has the shortest duty cycle, the radiant intensity of the emitter may be limited by a safety limit associated with the given emission band and application. For example, in an IR VCSEL array each VCSEL may be operated at a power level that approaches the eye safety limit when synchronized with a rolling shutter operating with minimum integration time. As shown on the secondary axis of the graph in FIG. 6, the emission time 620 for each emitter in a projection array may be a linearly decreasing function of inverse integration time.

Figure 7:
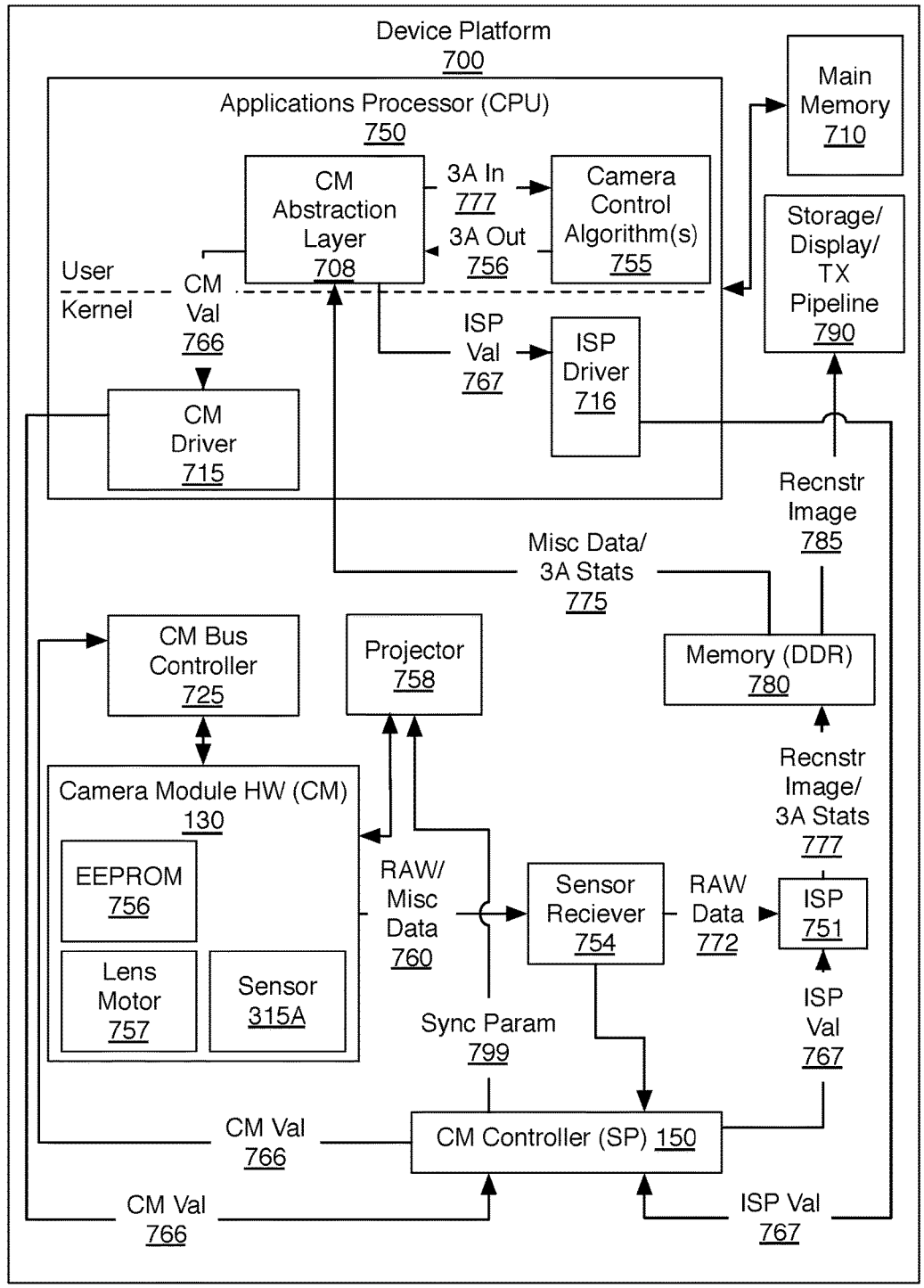
FIG. 7 is device platform including a camera and a light projector, in accordance with some embodiments.

FIG. 7 is device platform 700 including CM 130 and a light projector 758, in accordance with some embodiments. In the illustrated embodiment, CM 130 further includes EEPROM 756, optional lens motor 757, and image sensor 315A. Image sensor 315A may have any of the properties described elsewhere herein. Sensor 315A may be controlled to operate a rolling shutter or electronic focal plane shutter process where pixels are read out progressively in a line-sequential fashion for a frame, as described elsewhere herein. CM 130 may have a number of control registers (e.g., 16-bit) addressable for example, through a camera control bus with an 8-bit address. Control registers of CM 130 may be programmed for example through an I²C serial interface managed by camera control bus controller 725 (e.g., an I²C controller).

CM 130 is to output image data 760. This data may include a description of the CM control parameters (e.g., exposure parameters such as exposure time, analog gain, digital gain, etc.) that were in effect during collection of the raw image data. Image data 760 is passed to a sensor receiver 754 that supports the streaming protocol employed by CM 130, such as a MIPI or other input protocol. Sensor receiver 754 is further to output raw image data 772 to one or more image signal processor (ISP) 751.

ISP 751 may receive and analyze the raw image data 772 during the horizontal and/or vertical blanking periods associated with CM 130. During raw image data processing, ISP 751 may perform one or more of computation of depth information, noise reduction, pixel linearization, and shading compensation, for example. ISP 751 may also perform resolution reduction, Bayer demosaic, and/or vignette elimination, for example. ISP 751 may also calculate image statistics information. Image statistics may include luminance/chrominance values and averages, luminance/chrominance high frequency and texture content, motion content from frame to frame, any other color content values, picture statistical data regarding deblocking control (for example, information controlling deblocking/non-deblocking), RGBS grid, filter response grid, and RGB histograms, etc. ISP 751 may be compatible with video codecs, such as H.264/Advanced Video Coding (AVC) or High Efficiency Video Coding (HEVC), JPEG. etc., which may be utilized to post-process YUV data and generate reconstructed image data and calculated 3A statistics 777. Reconstructed image data and calculated 3A statistics 777 are stored in memory 280 (e.g., a double data rate (DDR), or other suitable memory). Reconstructed image data 785 may then be read out to one or more of a storage, display pipeline or transmission pipeline 790, to store display, or transmit a representation of collected frames.

3A statistics 775 may be accessed from memory 780 by applications processor 750 for further analysis, for example during a 3A control loop iteration. In the exemplary embodiment, applications processor 750 instantiates an operating system including a user space and a kernel space. Applications processor 750 may have many functions within a device platform beyond camera control. Applications processor 750 may be a large vector processor with access to a main memory 710. Applications processor 750 is to execute camera control algorithm(s) 155, based on for example 3A input 777 received through CM abstraction layer 708. CM abstraction layer 708 may be any hardware abstraction layer configured for the particular operating system instantiated. CM abstraction layer 708 may for example handle compatibility between third-party 3A control algorithms and CM 130, and/or ISP 180.

Execution of CCA 755 may further entail accessing at least one of an automatic exposure or auto automatic white balance library stored in main memory 708 to generate CM control parameter values. In one exemplary AEC embodiment, execution of CCA 755 entails performing an exposure calculation that generates target total exposures and corresponding frame numbers. The target total exposures are included in 3A output 756 passed to CM abstraction layer 708. CM abstraction layer 708 passes values in 3A output 756 associated with CM 130 as CM control parameter values 766 to CM driver 715. CM abstraction layer 708 passes values in 3A output 756 associated with ISP 180 as ISP control parameter values 767 to ISP driver 716.

CM driver 715 passes CM control parameter values 766 to CM controller 150. ISP driver 716 likewise passes ISP control parameter values 767 to CM controller 150 where the values are queued and sequentially dispatched as CM parameter values 766 to CM bus controller 725. CM bus controller 725 writes CM values 766 to a CM register in synchronization with actions of CM 130 associated with exposing a next frame, and consecutive frames thereafter. CM controller 150 is further to queue ISP values 767 and sequentially dispatches them to ISP 751.

In an exemplary embodiment, CM controller 150 is further to communicate sync parameters 799 to projector 758. Projector 758 is operable in a rolling illumination mode and may, for example, include light projection array 100 and projector controller 140, as described elsewhere herein. Sync parameters 799 may be based on CM parameters values 766. For example, sync parameters 799 may include an indication of integration time that will be used by sensor array 315A for an upcoming frame collection. Sync parameters 799 may alternatively specify a projector emitter duty cycle or otherwise specify an illumination roll rate that is to be employed when CM 130 subsequently triggers projector 758. Sync parameters 799 may further specify a projector emitter peak power level that is to be employed when CM 130 subsequently triggers projector 758. Although illustrated as a component external to CM 130, projector 758 may instead be a component of CM 130. For such embodiments, CM values 766 may specify a projector line duty cycle or otherwise specify an illumination roll rate when projector 758 is subsequently triggered.

Figure 8:
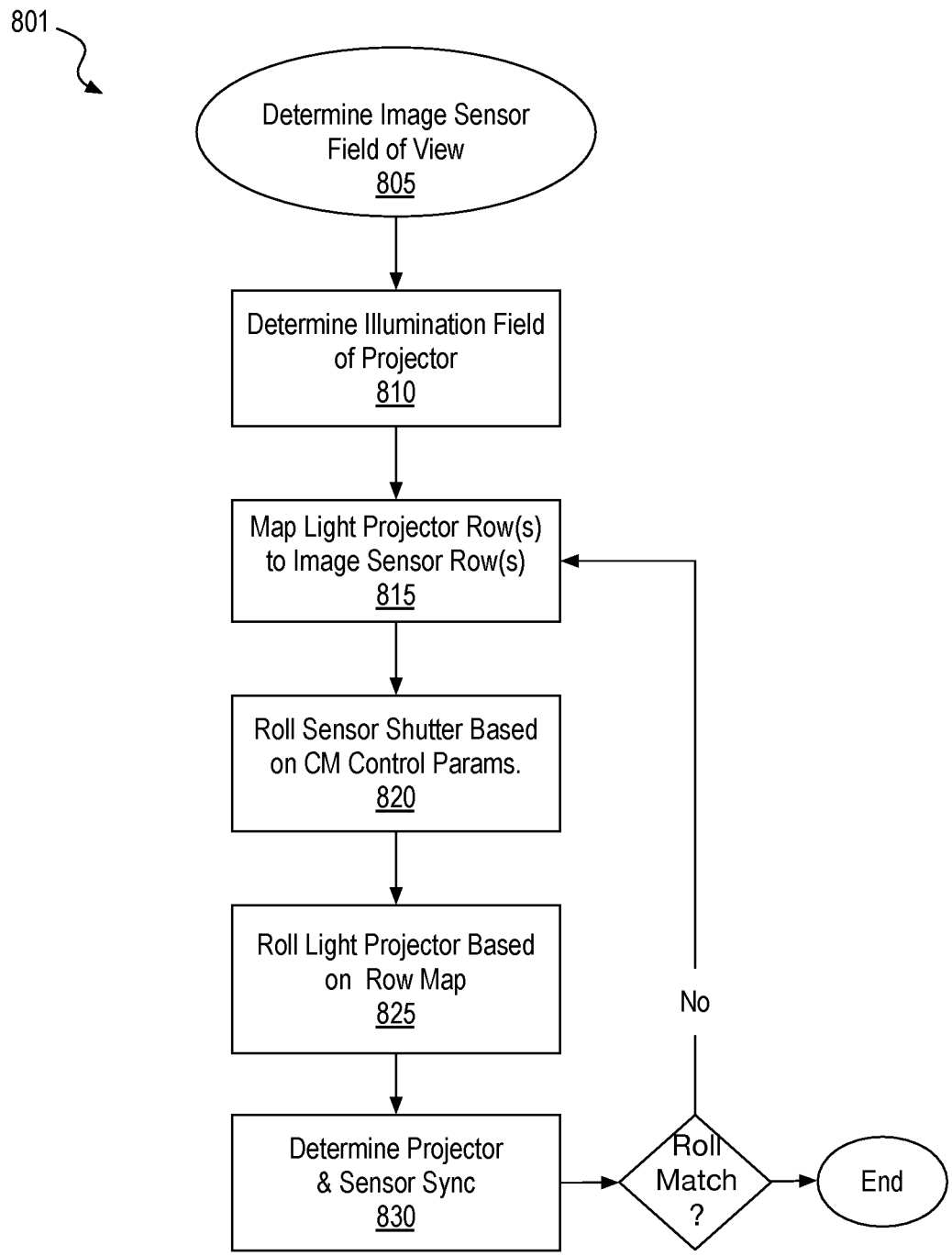
FIG. 8 is a method of calibrating a rolling light projector to a rolling shutter camera, in accordance with some embodiments.

FIG. 8 is a method 801 for calibrating a rolling light projector to a rolling shutter camera, in accordance with some embodiments. Method 801 may be performed during an initial setup/test phase in the manufacture of a camera platform, for example. Method 801 begins at operation 805 where the FOV of one or more image sensors included in the camera platform is determined. The determination may be based on component specifications and/or a result of active measurement with a test rig. At operation 810, the illumination field of the platform's projector is determined. This determination may also be based on component specifications and/or a result of active measurement with a test rig. At operation 815, system data fields are populated with an indication of the light projection array lines (e.g., rows) that correspond with the light sensor array lines (e.g., rows). This projector row-to-sensor row mapping may be stored to a platform PROM, for example. At operations 820 and 825 the camera platform is operated with the sensor shutter rolling based on CM control parameters concurrently with the light projector rolling based on at least the row mapping. The light projector roll may also be based on the CM control parameters, for example as described elsewhere herein.

At operation 830, synchronization between the projector and sensor array is assessed. In some embodiments, operation 830 entails displaying a map of markers representing the projected pattern as collected by the sensor. Operation 830 may also entail counting and/or spatially mapping the number of illumination points within a frame. Errors in the collection of the projected pattern and/or depth information computed based on the collection of the projected pattern may assessed to determine if the projector roll is sufficiently synchronized with the rolling sensor shutter. For example, deviations between the count and the number of emitters and/or inconsistency in the locations of the illumination points may indicate synchronization errors. If the roll is sufficiently matched, method 801 ends, otherwise calibration continues with an adjustment to the projector row:sensor row mapping, for example to account for physical misalignment of the projector relative to the sensor, etc.

Figure 9:
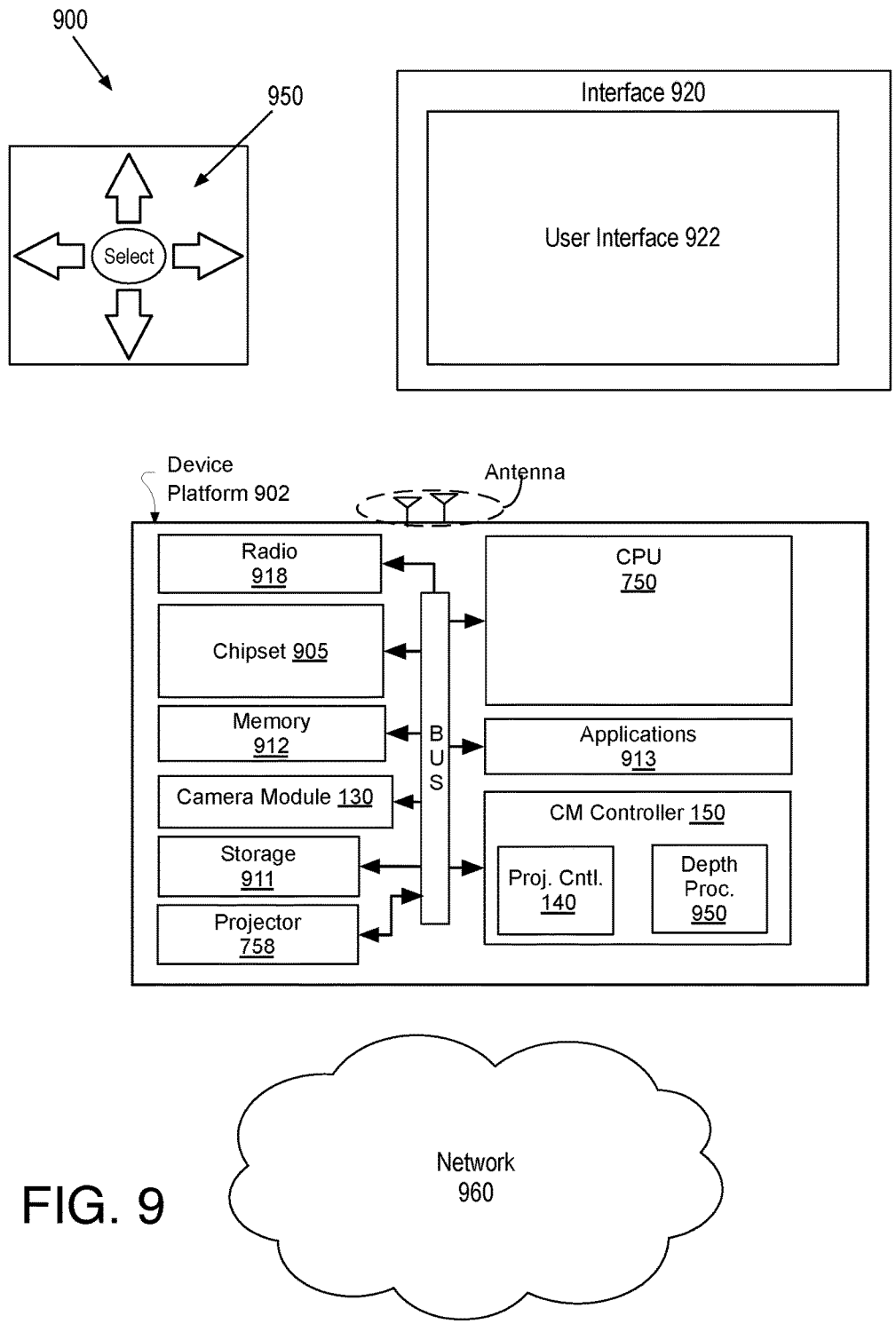
FIG. 9 is a diagram of an exemplary system employing a camera and rolling projector in accordance with some embodiments.

FIG. 9 is an illustrative diagram of an exemplary system 900, in accordance with embodiments. System 900 may be a mobile device although system 900 is not limited to this context. For example, system 900 may be incorporated into a laptop computer, ultra-laptop computer, tablet, touch pad, portable computer, handheld computer, palmtop computer, cellular telephone, smart device (e.g., smart phone, smart tablet or mobile television), mobile internet device (MID), messaging device, data communication device, and so forth. System 900 may also be an infrastructure device. For example, system 900 may be incorporated into a large format television, set-top box, desktop computer, or other home or commercial network device.

System 900 includes a device platform 902 that may implement all or a subset of the various camera and projector control methods as well as any of the camera control platforms described above in the context of FIG. 1A-FIG. 7. CPU 750 may include logic circuitry to generate a frame-based series of control parameters for controlling CM 130 and projector 758 in a synchronized roll. In some embodiments, one or more computer readable media may store instructions, which when executed by CPU 750, cause the processor to generate a frame-based series of control parameters for controlling CM 130 and projector 758 in a synchronized roll. One or more image frame exposed by CM 130 using light projection determined by CPU 750 may then be stored in memory 912.

In embodiments, device platform 902 is coupled to a human interface device (HID) 920. Platform 902 may collect raw image data with CM 130, which is processed based on depth information and output to HID 920. A navigation controller 950 including one or more navigation features may be used to interact with, for example, device platform 902 and/or HID 920. In embodiments, HID 920 may include any television type monitor or display coupled to platform 902 via radio 918 and/or network 960. HID 920 may include, for example, a computer display screen, touch screen display, video monitor, television-like device, and/or a television.

Under the control of one or more software applications 916, device platform 902 may display user interface 922 on HID 920. Movements of the navigation features of controller 950 may be replicated on a display (e.g., HID 920) by movements of a pointer, cursor, focus ring, or other visual indicators displayed on the display. For example, under the control of software applications 916, the navigation features located on navigation controller 950 may be mapped to virtual navigation features displayed on user interface 922.

Device platform 902 may include any combination of projector 758, CM 130, chipset 905, processor 750, controller 150, memory 912, storage 911, applications 916, and radio 918 known in the art. Chipset 905 may provide intercommunication among projector 758, CM 130, processor 750, controller 150, memory 912, storage 911, applications 916 and radio 918.

Processor 750 may be implemented as one or more Complex Instruction Set Computer (CISC) or Reduced Instruction Set Computer (RISC) processors; x86 instruction set compatible processors, multi-core, or any other microprocessor or central processing unit (CPU). Memory 912 may be implemented as a volatile memory device such as, but not limited to, a Random Access Memory (RAM), Dynamic Random Access Memory (DRAM), or Static RAM (SRAM). Storage 911 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. Radio 918 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 918 may operate in accordance with one or more applicable wireless standards versions.

In embodiments, system 900 may be implemented as a wireless system, a wired system, or a combination of both. When implemented as a wireless system, system 900 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 900 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

The synchronized rolling projector and camera architectures described herein may be implemented in various hardware architectures, cell designs, or "IP cores."

Figure 10A:
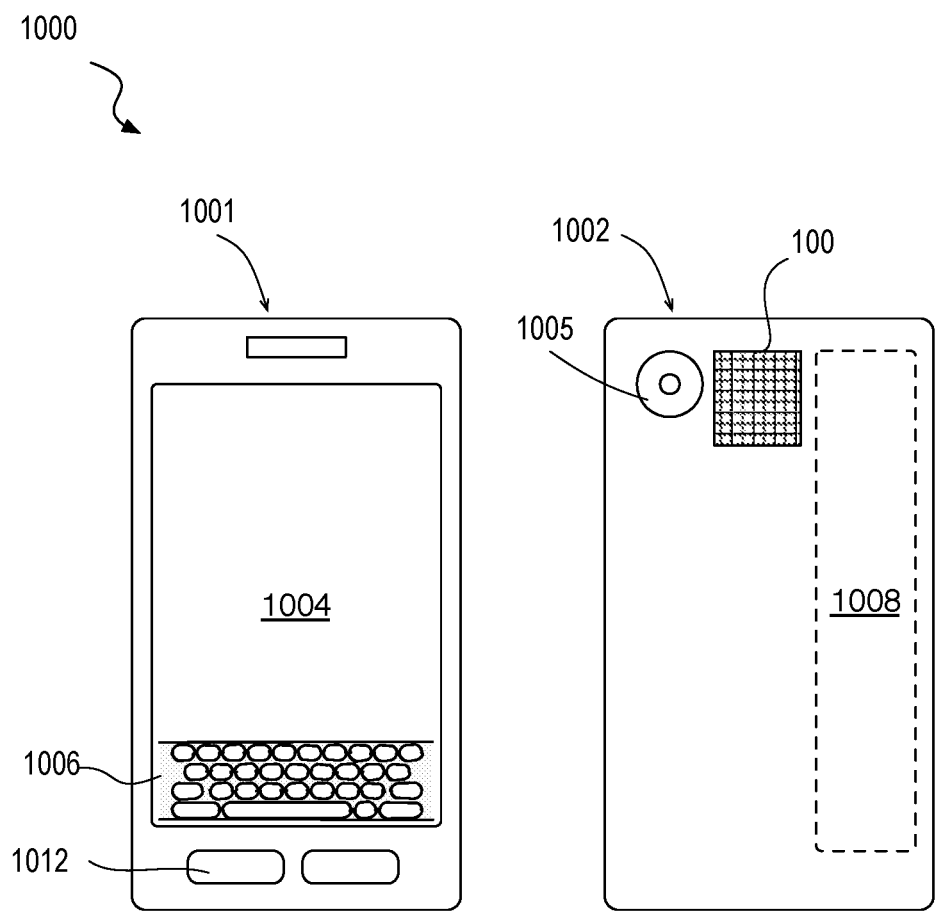
FIG. 10A is a diagram of an exemplary mobile handset platform including a camera and a rolling light projector, in accordance with some embodiments.

As described above, system 900 may be embodied in varying physical styles or form factors. FIG. 10A illustrates embodiments of a mobile handset device 1000 in which system 900 may be embodied. In embodiments, for example, device 1000 may be implemented as a mobile computing device having wireless capabilities. A mobile computing device may refer to any device having a processing system and a mobile power source or supply, such as one or more batteries, for example. Examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smartphone, tablet or smart television), mobile internet device (MID), messaging device, data communication device, and so forth. Examples of a mobile computing device also may include computers and/or media capture/transmission devices configured to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 10A, mobile handset device 1000 may include a housing with a front 1001 and back 1002. Device 1000 includes a display 1004, an input/output (I/O) device 1006, and an integrated antenna 1008. Device 1000 also may include navigation features 1012. Display 1004 may include any suitable display unit for displaying information appropriate for a mobile computing device. I/O device 1006 may include any suitable I/O device for entering information into a mobile computing device. Examples for I/O device 1006 may include an alphanumeric keyboard, a numeric keypad, a touch pad, input keys, buttons, switches, microphones, speakers, voice recognition device and software, and so forth. Information also may be entered into device 1000 by way of microphone (not shown), or may be digitized by a voice recognition device. Embodiments are not limited in this context. Integrated into at least the back 1002 is camera 1005 (e.g., including one or more lenses, apertures, and image sensors). Also visible in back 1002 is light projection array 100, for example as described elsewhere herein.

Figure 10B:
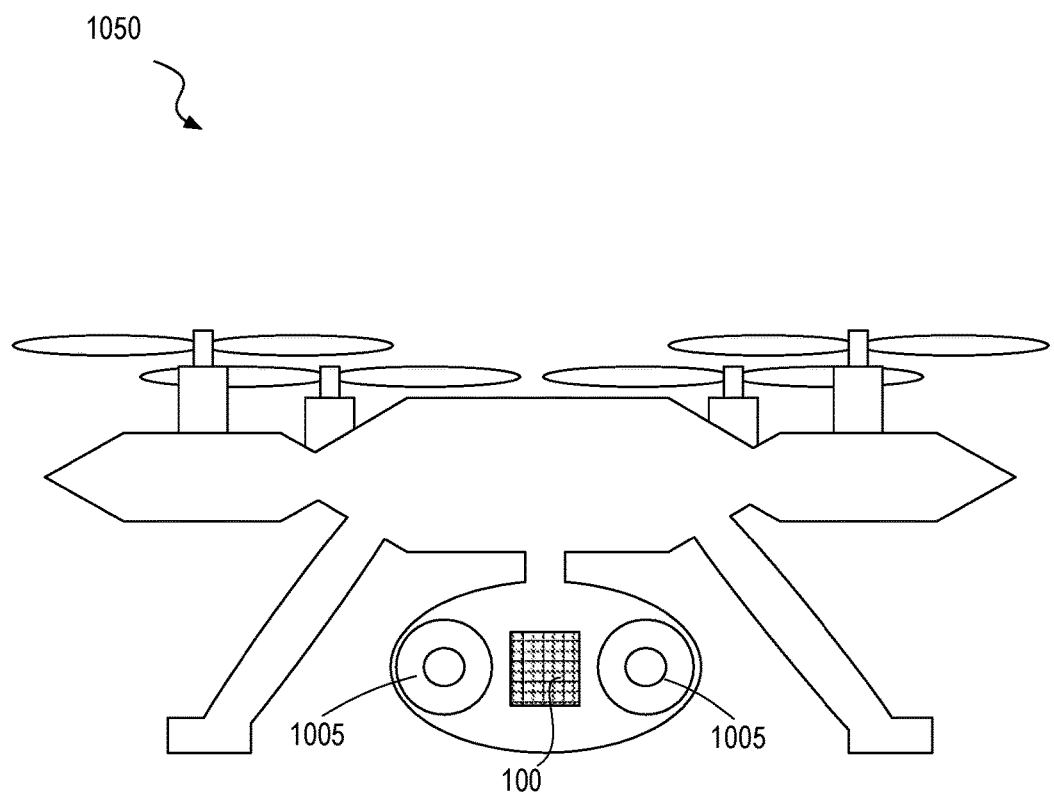
FIG. 10B is a diagram of an exemplary quadcopter platform including a camera and a rolling light projector, in accordance with some embodiments.

FIG. 10B is a diagram of an exemplary quadcopter platform 1050 including one or more camera 1005 and light projection array 100, in accordance with some embodiments. Each camera 1005 may include one or more lenses, apertures, and image sensors. Projection array 100 may have any of the attributes described elsewhere herein, and may be synchronized with camera 1005 in one or more of the manners described elsewhere herein. Quadcopter platform 1050 includes two pairs of fixed pitched propellers; a first pair providing lift when rotating clockwise (CW) and a second pair providing lift when rotating counterclockwise (CCW). Quadcopter platform 1050 includes one or more computer processors, electronic accelerometers, and a global positioning system (GPS). Quadcopter platform 1050 may be configured for autonomous aerial photography and/or surveillance. Computer processors may execute software, such as the PX4 autopilot system, that allows a user to define way-points to which the quadcopter platform 1050 will autonomously fly and perform a task. One such task may be aerial photography with camera 1005 operating with a rolling shutter synchronized with rolling illumination from light projection array 100, for example as described elsewhere herein.

Embodiments described herein may be implemented using hardware elements, software elements, or a combination of both. Examples of hardware elements or modules include: processors, microprocessors, circuitry, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software elements or modules include: applications, computer programs, application programs, system programs, machine programs, operating system software, middleware, firmware, routines, subroutines, functions, methods, procedures, software interfaces, application programming interfaces (API), instruction sets, computing code, computer code, code segments, computer code segments, data words, values, symbols, or any combination thereof. Determining whether an embodiment is implemented using hardware elements and/or software elements may vary in accordance with any number of factors considered for the choice of design, such as, but not limited to: desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable storage medium. Such instructions may reside, completely or at least partially, within a main memory and/or within a processor during execution thereof by the machine, the main memory and the processor portions storing the instructions then also constituting a machine-readable storage media. Programmable logic circuitry may have registers, state machines, etc. configured by the processor implementing the computer readable media. Such logic circuitry, as programmed, may then be understood to have been physically transformed into a system falling within the scope of the embodiments described herein. Instructions representing various logic within the processor, which when read by a machine may also cause the machine to fabricate logic adhering to the architectures described herein and/or to perform the techniques described herein. Such representations, known as cell designs, or IP cores, may be stored on a tangible, machine-readable medium and supplied to various customers or manufacturing facilities to load into the fabrication machines that actually make the logic or processor.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Further examples of specific embodiments are now provided below.

In one or more first embodiments, a camera platform comprises an image sensor array coupled to a rolling shutter controller to sequentially collect light from portions of a scene within a field of view of the sensor array, and a light projector to sequentially cast a light pattern upon portions of the scene in synchronization with the sequential light collection.

In one or more second embodiments, for any of the first embodiments the rolling shutter controller is to collect light from each of the portions of the scene with one or more corresponding lines of sensor pixels. The light projector comprises one or more lines of light emitters, each of the emitters corresponding to one or more illumination point within the light pattern. The rolling projector is to illuminate the portions of the scene with corresponding ones of the light emitters.

In one or more third embodiments, for any of the second embodiments each of the light emitters comprises a vertical cavity surface-emitting laser (VCSEL), and one or more of the VCSELs corresponding to a single portion of the light pattern is configured to be driven separately from other VCSELs corresponding to other portions of the light pattern.

In one or more fourth embodiments, for any of the second embodiments the rolling projector comprises a laser optically coupled to a MEMS mirror scanner, and the MEMS mirror scanner is to sweep the light pattern across the field of view in synchronization with the sequential light collection.

In one or more fifth embodiments, for any of the first through fourth embodiments a first sensor pixel line is to integrate photocharge for a first portion of the scene over a first time increment. A second sensor pixel line is to integrate photocharge for a second portion of the scene over a second time increment. The rolling projector is to illuminate the first portion of the scene with one or more first light emitters during the first time increment while one or more second light emitters are not emitting, and illuminate the second portion of the scene with the one or more second light emitters during the second time increment while the one or more first light emitters are not emitting.

In one or more sixth embodiments, for any of the first through fifth embodiments the synchronization with the sequential light collection is based, at least in part, on a mapping between a first number of sensor pixels or pixel lines in the sensor array that are to collect light for a first portion of the scene and a second number of light emitters or emitter lines of the light projector that are to illuminate the first portion of the scene.

In one or more seventh embodiments, for any of the second through sixth embodiments the rolling projector is to drive each of the light emitters to output light of an intensity that varies inversely with sensor pixel integration time.

In one or more eighth embodiments, for any of the second through seventh embodiments the rolling projector is to determine a duty cycle for light emitters based, at least in part, on an integration time of sensor pixel in the sensor array.

In one or more ninth embodiments, for any of the second through eighth embodiments the rolling projector is to drive each of the light emitters to output light of an intensity that varies inversely with the duty cycle of the light emitter lines.

In one or more tenth embodiments, for any of the first through ninth embodiments the rolling shutter controller is to cycle through all sensor pixel lines in the sensor array within a frame time, and the rolling projector is to cycle through all light emitters within the frame time.

In one or more eleventh embodiments, a method of capturing an image comprises sequentially collecting light from portions of a scene with sensor pixel lines of an image sensor array, and sequentially casting a light pattern upon the portions of the scene in synchronization with the sequential light collection.

In one or more twelfth embodiments, for any of the eleventh embodiments the light pattern is cast by a plurality of light emitters, each comprising a vertical cavity surface-emitting laser (VCSEL), and one or more of the VCSELs corresponding to a single portion of the light pattern is driven to emit light independently of other VCSELs corresponding to other portions of the light pattern.

In one or more thirteenth embodiments, for any of the eleventh through twelfth embodiments sequentially collecting light from portions of a scene further comprises integrating photocharge for a first portion of the scene with a first sensor pixel line over a first time increment, and integrating photocharge for a second portion of the scene with a second sensor pixel line over a second time increment, and sequentially casting the light pattern upon the portions of the scene further comprises illuminating the first portion of the scene with one or more first light emitters during the first time increment while one or more second light emitters are not emitting, and illuminating the second portion of the scene with the one or more second light emitters during the second time increment while the one or more first light emitters are not emitting.

In one or more fourteenth embodiments, for any of the eleventh through thirteenth embodiments the synchronization with the sequential light collection is based, at least in part, on a mapping between a first number of sensor pixels in the sensor array that are to collect light for a first portion of the scene and a second number of light emitters of a light projector that are to illuminate the first portion of the scene.

In one or more fifteenth embodiments, for any of the eleventh through fourteenth embodiments the method further comprising setting a duty cycle for light emitters in the light projection array based, at least in part, on an integration time of sensor pixel lines in the sensor array.

In one or more sixteenth embodiments, for any of the eleventh through fifteenth embodiments the method comprises driving a light emitter to output light of an intensity that varies inversely with the duty cycle of the light emitter lines.

In one or more seventeenth embodiments, for any of the eleventh through sixteenth embodiments the method comprises computing an auto exposure time, setting the integration time based on the auto exposure time, and setting the duty cycle based on the auto exposure time.

In one or more eighteenth embodiments, a non-transitory computer-readable storage media with instructions stored thereon, which when executed by one or more processors, cause the processors to perform a method, comprising sequentially collecting light from portions of a scene with sensor pixel lines of an image sensor array; and sequentially casting a light pattern upon the portions of the scene in synchronization with the sequential light collection.

In one or more nineteenth embodiments, for any of the eighteenth embodiments sequentially collecting light from portions of a scene further comprises integrating photocharge for a first portion of the scene with a first sensor pixel line over a first time increment, and integrating photocharge for a second portion of the scene with a second sensor pixel line over a second time increment. Sequentially casting the light pattern upon the portions of the scene further comprises illuminating the first portion of the scene with one or more first light emitters during the first time increment while one or more second light emitters are not emitting, and illuminating the second portion of the scene with the one or more second light emitters during the second time increment while the one or more first light emitters are not emitting.

In one or more twentieth embodiments, for any of the eighteenth through nineteenth embodiments the media further comprises instructions to cause the processors to perform the method further comprising accessing data mapping a first number of sensor pixels or pixel lines in the sensor array that are to collect light for a first portion of the scene to a second number of light emitters or emitter lines that are to illuminate the first portion of the scene.

In one or more twenty-first embodiments, for any of eighteenth through twentieth embodiments the media further comprises instructions to cause the processors to perform the method further comprising setting a duty cycle for light emitters of a light projector based, at least in part, on an integration time of sensor pixel lines in the sensor array.

In one or more twenty-second embodiments, for any of the eighteenth through twenty-first embodiments the media further comprises instructions to cause the processors to perform the method further comprising driving a light emitter to output light of an intensity that varies inversely with the duty cycle of the light emitter.

In one or more twenty-third embodiments, a method calibrating a rolling projector to an image sensor comprises determining an image sensor field of view, determining a projector field of illumination, and mapping a first number of image sensor pixels or pixel lines that are to collect light for a first portion of the scene to a second number of light emitters or emitter lines in the rolling projector that are to illuminate the first portion of the scene with a pattern, wherein the mapping is based on the image sensor field of view and the projector field of illumination.

In one or more twenty-fourth embodiments, for any of the twenty-third embodiments the method further comprises integrating photocharge for a first portion of a scene with a first sensor pixel line over a first time increment, and integrating photocharge for a second portion of the scene with a second sensor pixel line over a second time increment. The method further comprises illuminating the first portion of the scene with one or more first light emitters during the first time increment while one or more second light emitters is not emitting, and illuminating the second portion of the scene with the one or more second light emitters during the second time increment while the one or more first light emitters are not emitting. The method comprises counting or spatially mapping features in the pattern detected by the first and second pixel lines within an image frame.

In one or more twenty-fifth embodiment, for any of the twenty-third through twenty-fourth embodiments the method further comprises modifying the first number of sensor pixel lines mapped to the second number of light emitters based on the counting or mapping.

In one or more twenty-sixth embodiment, a camera system comprises an image sensing means and a light projection means coupled to a processing means to perform any of the eleventh through seventeenth embodiments.

It will be recognized that the embodiments is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A camera platform comprising:
    first and second image sensor arrays, each of the sensor arrays coupled to a rolling shutter controller to sequentially collect light from portions of a scene with lines of sensor pixels corresponding to the portions, wherein the first sensor array is to generate first image frame data from a first viewpoint, and the second sensor array is to generate second image frame data from a second viewpoint;
    a rolling light projector comprising lines of light emitters to sequentially cast a fixed light pattern upon portions of the scene in synchronization with the sequential light collection, wherein each of the light emitters corresponds to one or more illumination points within the fixed light pattern, and the rolling light projector controller is to illuminate the portions of the scene with corresponding lines of the light emitters, individual ones of the emitters driven at a power level that varies according to an inverse function of sensor pixel line integration time between a lower threshold associated with a thermal limit for continuous emission, and an upper threshold exceeding the lower threshold; and
    a processor to determine, from the light pattern as collected by the sensor arrays, disparity values for pixels in the first image frame data based on a pixel correspondence between the first and second image frame data.

2. The platform of claim 1, wherein each of the emitters comprises a vertical cavity surface-emitting laser (VCSEL); and
    one or more of the VCSELs corresponding to a single portion of the light pattern is configured to be driven separately from other VCSELs corresponding to other portions of the light pattern.

3. The platform of claim 1, wherein:
    a first sensor pixel line is to integrate photocharge for a first portion of the scene over a first time increment;
    a second sensor pixel line is to integrate photocharge for a second portion of the scene over a second time increment; and
    the rolling projector is to illuminate the first portion of the scene with one or more first light emitters during the first time increment while one or more second light emitters are not emitting, and illuminate the second portion of the scene with the one or more second light emitters during the second time increment while the one or more first light emitters are not emitting.

4. The platform of claim 1, wherein the synchronization with the sequential light collection is based, at least in part, on a mapping between a first number of sensor pixels or pixel lines in the sensor array that are to collect light for a first portion of the scene and a second number of light emitters or emitter lines in the light projector that are to illuminate the first portion of the scene.

5. The platform of claim 1, wherein the rolling shutter controller is to cycle through all sensor pixel lines in the sensor array within a frame time, and the rolling projector is to cycle through all light emitters in the light projection array within the frame time.

6. A method of capturing an image, comprising:
sequentially collecting light from portions of a scene with sensor pixel lines of first and second image sensor arrays, the sensor pixel lines corresponding with the portions of the scene;
generating first image frame data associated with a first viewpoint based on the first image sensor array, and generating second image frame data associated with a second viewpoint based on the second image sensor array;
sequentially casting a fixed light pattern upon the portions of the scene with a rolling light projector in synchronization with the sequential light collection, wherein the rolling light projector comprises lines of light emitters to illuminate separate portions of the scene, and each of the light emitters corresponds to one or more illumination points within the fixed light pattern, and wherein casting the fixed light pattern comprises driving individual ones of the emitters at a power level that varies according to an inverse function of sensor pixel line integration time between a lower threshold associated with a thermal limit for continuous emission, and an upper threshold exceeding the lower threshold; and
determining, from the light pattern as collected by the sensor arrays, disparity values for pixels in the first image frame data based on a pixel correspondence between the first and second image frame data.

7. The method of claim 6, wherein:
individual ones of the emitters comprise a vertical cavity surface-emitting laser (VCSEL); and
one or more of the VCSELs corresponding to a single portion of the light pattern is driven to emit light independently of other VCSELs corresponding to other portions of the light pattern.

8. The method of claim 6, wherein:
sequentially collecting light from portions of a scene further comprises integrating photocharge for a first portion of the scene with a first sensor pixel line over a first time increment, and integrating photocharge for a second portion of the scene with a second sensor pixel line over a second time increment; and
sequentially casting the light pattern upon the portions of the scene further comprises illuminating the first portion of the scene with one or more first light emitters during the first time increment while one or more second light emitters are not emitting, and illuminating the second portion of the scene with the one or more second light emitters during the second time increment while the one or more first light emitters are not emitting.

9. The method of claim 6, wherein the synchronization with the sequential light collection is based, at least in part, on a mapping between a first number of sensor pixels or pixel lines in the sensor array that are to collect light for a first portion of the scene and a second number of light emitters or emitter lines of a light projector that are to illuminate the first portion of the scene.

10. The method of claim 6, further comprising:
computing an auto exposure time; and
setting the integration time based on the auto exposure time.

11. A non-transitory computer-readable storage media with instructions stored thereon, which when executed by one or more processors, cause the processors to perform a method, comprising:
sequentially collecting light from portions of a scene with sensor pixel lines of-first and second image sensor arrays, the sensor pixel lines corresponding with the portions of the scene;
generating first image frame data associated with a first viewpoint based on the first image sensor array, and generating second image frame data associated with a second viewpoint based on the second image sensor array;
sequentially casting a fixed light pattern upon the portions of the scene with a rolling light projector in synchronization with the sequential light collection, wherein the rolling light projector comprises lines of light emitters to illuminate separate portions of the scene, and each of the light emitters corresponds to one or more illumination points within the fixed light pattern, and wherein casting the fixed light pattern comprises driving individual ones of the emitters at a power level that varies according to an inverse function of sensor pixel line integration time between a lower threshold associated with a thermal limit for continuous emission and an upper threshold exceeding the lower threshold; and
determining, from the light pattern as collected by the sensor arrays, disparity values for pixels in the first image frame data based on a pixel correspondence between the first and second image frame data.

12. The media of claim 11, wherein
sequentially collecting light from portions of a scene further comprises integrating photocharge for a first portion of the scene with a first sensor pixel line over a first time increment, and integrating photocharge for a second portion of the scene with a second sensor pixel line over a second time increment; and
sequentially casting the light pattern upon the portions of the scene further comprises illuminating the first portion of the scene with one or more first light emitters during the first time increment while one or more second light emitters are not emitting, and illuminating the second portion of the scene with the one or more second light emitters during the second time increment while the one or more first light emitters are not emitting.

13. The media of claim 11, wherein the media further comprises instructions to cause the processors to perform the method further comprising accessing data mapping a first number of sensor pixels or pixel lines in the sensor array that are to collect light for a first portion of the scene to a second number of light emitters or emitter lines in a light projection array that are to illuminate the first portion of the scene.

* * * * *